(12) United States Patent
Skeete et al.

(10) Patent No.: US 11,462,580 B2
(45) Date of Patent: Oct. 4, 2022

(54) IMAGE SENSOR PACKAGES AND RELATED METHODS

(71) Applicant: SEMICONDUCTOR COMPONENTS INDUSTRIES, LLC, Phoenix, AZ (US)

(72) Inventors: Oswald L. Skeete, Phoenix, AZ (US); Brian Anthony Vaartstra, Nampa, ID (US); Derek Gochnour, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 108 days.

(21) Appl. No.: 16/455,094

(22) Filed: Jun. 27, 2019

(65) Prior Publication Data

US 2020/0411573 A1 Dec. 31, 2020

(51) Int. Cl.
| | |
|---|---|
| *H01L 27/146* | (2006.01) |
| *H01L 21/768* | (2006.01) |
| *H01L 21/56* | (2006.01) |
| *H01L 23/48* | (2006.01) |

(Continued)

(52) U.S. Cl.
CPC ...... *H01L 27/14618* (2013.01); *H01L 21/565* (2013.01); *H01L 21/76898* (2013.01); *H01L 23/481* (2013.01); *H01L 24/08* (2013.01); *H01L 27/1464* (2013.01); *H01L 27/1469* (2013.01); *H01L 27/14621* (2013.01); *H01L 27/14627* (2013.01); *H01L 27/14634* (2013.01); *H01L 27/14636* (2013.01); *G02B 3/0006* (2013.01); *H01L 24/16* (2013.01); *H01L 24/81* (2013.01); *H01L 2224/0557* (2013.01); *H01L 2224/08147* (2013.01); *H01L 2224/16113* (2013.01); *H01L 2224/16227* (2013.01); *H01L 2224/16237* (2013.01); *H01L 2224/81024* (2013.01);

(Continued)

(58) Field of Classification Search
CPC ......... H01L 27/14618; H01L 27/14634; H01L 27/1469; H01L 27/14621; H01L 27/1464; H01L 27/14636; H01L 27/14627; H01L 23/481; H01L 21/565; H01L 21/76898; H01L 24/08; H01L 24/81; H01L 24/16; H01L 2224/16227; H01L 2224/16237; H01L 2224/81024; H01L 2224/08147; H01L 2224/16113; H01L 2224/81815; H01L 2224/0557; H01L 2924/14335; G02B 3/0006
USPC ....................................................... 257/432
See application file for complete search history.

(56) References Cited

U.S. PATENT DOCUMENTS 9,368,535 B2    6/2016  Skeete
2006/0023108 A1* 2/2006 Watanabe ......... H01L 27/14621
                                                   348/335

(Continued)

*Primary Examiner* — Ajay Arora
*Assistant Examiner* — Gardner W. S. Swan
(74) *Attorney, Agent, or Firm* — Adam R. Stephenson, LTD.

(57) ABSTRACT

Implementations of image sensor packages may include a plurality of microlenses coupled over a color filter array (CFA), a low refractive index layer directly coupled to and over the plurality of microlenses, an adhesive directly coupled to and over the low refractive index layer, and an optically transmissive cover directly coupled to and over the adhesive. Implementations may include no gap present between the optically transmissive cover and the plurality of microlenses.

16 Claims, 10 Drawing Sheets

(51) Int. Cl.
*H01L 23/00* (2006.01)
*G02B 3/00* (2006.01)

(52) U.S. Cl.
CPC ............... *H01L 2224/81815* (2013.01); *H01L 2924/14335* (2013.01)

(56) References Cited

U.S. PATENT DOCUMENTS

| | | | |
|---|---|---|---|
| 2006/0043515 A1* | 3/2006 | Ford | H01L 27/14623 257/436 |
| 2014/0284746 A1* | 9/2014 | Suzuki | H01L 27/14625 257/432 |
| 2016/0013233 A1* | 1/2016 | Noudo | H04N 5/3696 250/208.1 |
| 2018/0097029 A1* | 4/2018 | Kurihara | H01L 27/14618 |
| 2018/0138225 A1* | 5/2018 | Kim | H01L 21/565 |

* cited by examiner

IMAGE SENSOR PACKAGES AND RELATED METHODS

BACKGROUND

1. Technical Field

Aspects of this document relate generally to image sensors and image sensor packages.

2. Background

Image sensors convey information related to an image by communicating signals in response to incident electromagnetic radiation. Image sensors are used in a variety of devices including smart phones, digital cameras, night vision devices, medical imagers, and many others. Various types of image sensors exist, such as CMOS image sensors (CIS) and charge coupled devices (CCDs).

SUMMARY

Implementations of image sensor packages may include a plurality of microlenses coupled over a color-filter-array (CFA), a low refractive index layer directly coupled to and over the plurality of microlenses, an adhesive directly coupled to and over the low refractive index layer, and an optically transmissive cover directly coupled to and over the adhesive. Implementations may include no gap present between the optically transmissive cover and the plurality of microlenses.

Implementations of image sensor packages may include one, all, or any of the following:

The low refractive index layer may include one of an acrylic resin, polymer resins, an inorganic filler, inorganic fillers, an aerogel material, or any combination thereof.

The low refractive index layer may include a refractive index of 1.2.

The low refractive index layer may include a thickness less than 5 micrometers.

The adhesive layer may be directly coupled to an entire surface of the optically transmissive cover.

Implementations of image sensor packages may include a first side of a substrate coupled to a digital signal processor through a plurality of electrical contacts and an image sensor coupled to the first side of the substrate. Implementations of image sensor packages may also include an underfill layer coupled over the substrate, a plurality of microlenses coupled over the image sensor, and an optically transmissive cover coupled over the plurality of microlenses. Implementations may include no gap present between the optically transmissive cover and the plurality of microlenses Implementations of image sensor packages may include one, all, or any of the following:

Implementations may include a mold compound directly coupled to the first side of the substrate and to two or more sides of the optically transmissive cover, the image sensor, the digital signal processor, and the underfill layer.

Implementations may include a mold compound directly coupled over a first surface of the optically transmissive cover opposite a second surface of the optically transmissive cover facing the plurality of microlenses.

The image sensor package may include an adhesive and a low refractive index layer coupled between the optically transmissive cover and the plurality of microlenses.

The image sensor may be stacked over the digital signal processor and the digital signal processor may include a plurality of through silicon vias therein.

The low refractive index layer may include one of an acrylic resin, polymer resins, an inorganic filler, inorganic fillers, an aerogel material, or any combination thereof.

A perimeter of the optically transmissive cover may be smaller than a perimeter of the substrate.

The low refractive index layer may include a refractive index of 1.2.

Implementations of a method of forming an image sensor package may include bonding an image sensor wafer to a digital signal processor wafer, backgrinding the digital signal processor wafer to a predetermined thickness, and coupling an optically transmissive substrate over the image sensor wafer. Implementations may include no gap present between the optically transmissive substrate and the image sensor wafer. Implementations of a method of forming an image sensor package may also include exposing a plurality of electrical pads through an oxide layer using the optically transmissive substrate as a support, coupling a plurality of electrical contacts to the plurality of electrical pads, and singulating the optically transmissive substrate, the image sensor wafer, and the digital signal processor wafer into a plurality of optically transmissive covers, image sensor die, and digital signal processor die.

Implementations of methods of forming image sensor packages may include one, all, or any of the following:

Implementations may include coupling a mold compound to two or more sidewalls of each image sensor die, digital signal processor die, and optically transmissive cover.

Implementations may include forming a plurality of through-silicon-vias in the digital signal processor wafer.

Implementations may include applying an underfill compound between each of the plurality of electrical contacts.

Implementations may include applying an optically transmissive adhesive along an entire surface of the optically transmissive substrate.

Implementations may include applying a low refractive index layer over the image sensor wafer.

The low refractive index layer may include a refractive index of 1.2.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended image sensor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such image sensor packages, and implementing components and methods, consistent with the intended operation and methods.

Figure 1:
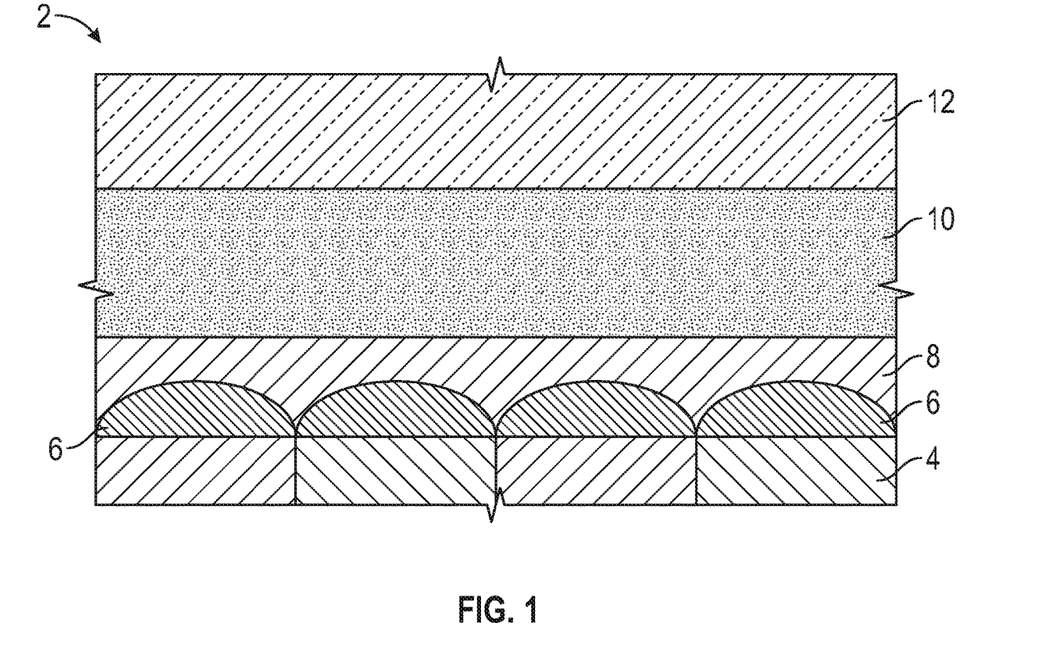
FIG. 1 is a cross-section side view of a portion of an image sensor package.

Referring to FIG. 1, a cross-section side view of a portion of an image sensor package is illustrated. In various implementations, the image sensor package 2 may include a color filter array (CFA) 4 coupled over an image sensor. The image sensor may be a CMOS image sensor (CIS) or any other type of image sensor. As illustrated by FIG. 1, the image sensor package 2 may include a plurality of microlenses 6 coupled to and over the CFA 4.

In various implementations, the image sensor package 2 includes a low refractive index layer 8 coupled to and over the plurality of microlenses 6. In particular implementations, and as illustrated, the low refractive index layer 8 is directly coupled to the plurality of microlenses. As illustrated, the low refractive index layer 8 may form a level layer above the CFA and microlenses 6. In other implementations, additional layers may separate the plurality of microlenses 6 from the low refractive index layer 8. The low refractive index layer 8 is optically transmissive. In various implementations, the low refractive index layer 8 has a refractive index of 1.2. In other implementations, the low refractive index layer 8 may have a refractive index more than or less than 1.2.

In various implementations the low refractive index layer 8 may be less than 5 micrometers (μm) thick. In particular implementations, the low refractive index layer 8 may be 1.2 μm thick. In other implementations, the thickness of the low refractive index layer 8 may be more than 5 μm thick. In particular implementations the low refractive index layer 8 includes one or more polymeric layers. The one or more polymeric layers may contain, by non-limiting example, one or more polymer resins, one or more acrylic resins, an inorganic filler, inorganic fillers, an aerogel material, aerogel materials, any combination thereof, or any other molecular materials that decrease a density of the low refractive index layer(s). In a particular implementation, the low refractive index layer may include a material marketed under the tradename of LAL-2020™ by Tokyo Ohka Kogyo Co., LTD of Kawasaki, Japan. In other implementations, the low refractive index layer 8 may include other materials.

In various implementations, the image sensor package 2 includes an adhesive 10 coupled to and over the low refractive index layer 8. In particular implementations, the adhesive 10 is directly coupled to the low refractive index layer 8, and may be directly coupled to an entire surface of the optically transmissive cover. In other implementations, additional layers may separate the low refractive index layer 8 from the adhesive 10. While FIG. 1 illustrates the adhesive 10 as over the low refractive index layer 8, in other implementations the low refractive index layer 8 may be over, or between the optically transmissive cover 12 and the adhesive 10. The adhesive 10 is optically transmissive. In various implementations the adhesive may be 40 μm thick. In other implementations, the adhesive may be more or less than 40 μm thick.

In various implementations, the adhesive 10 may include a refractive index of 1.5. In other implementations, the adhesive 10 may include a refractive index greater than or less than 1.5.

Still referring to FIG. 1, the image sensor package includes an optically transmissive cover 12 coupled to and over the adhesive. As illustrated, the optically transmissive cover 12 may be directly coupled to the adhesive 10. In other implementations, other materials may separate the optically transmissive cover 12 and the adhesive 10. The optically transmissive cover 12 may be transparent or translucent. In particular implementations, the optically transmissive cover 12 may include glass. In other implementations, the optically transmissive cover 12 may include other materials aside from glass. In various implementations, the optically transmissive cover may be 400 μm thick. In other implementations, the optically transmissive cover may be more or less than 400 μm thick.

Figure 26:
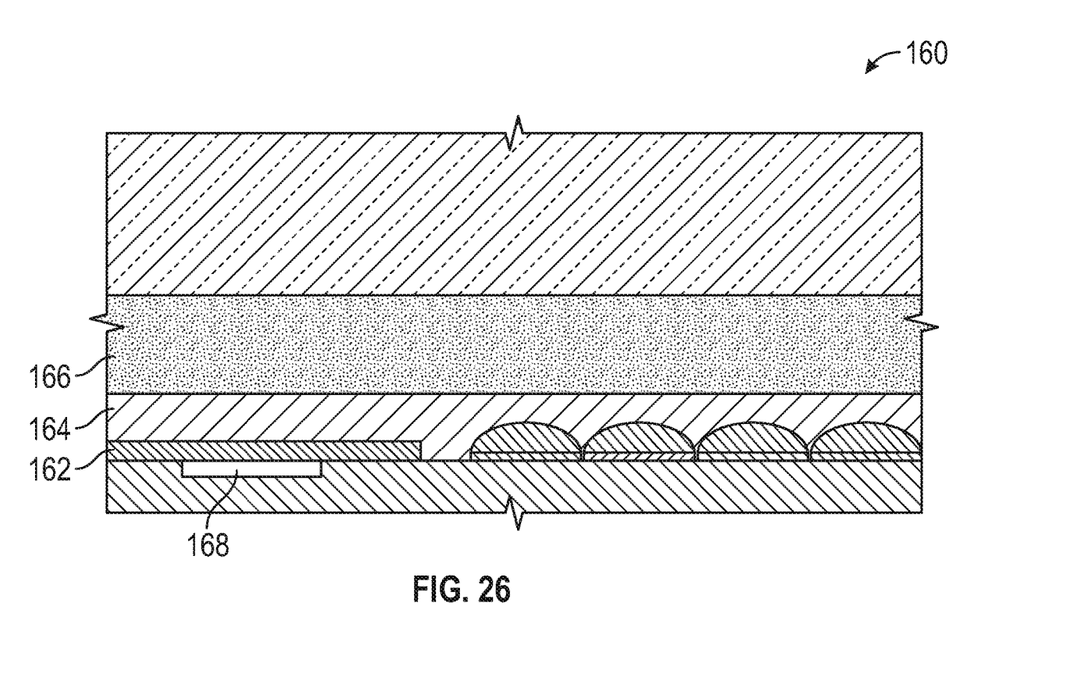
FIG. 26 is a cross section side view of an implementation of an image sensor package having a mask layer.

Referring to FIG. 26, an implementation of an image sensor package having a mask layer is illustrated. The image sensor package 160 of FIG. 26 may be the similar to the image sensor package 2 of FIG. 1, with the difference being that the image sensor package 160 may include a mask layer 162 coupled over/into the low refractive index layer 164. In various implementations, the semiconductor package may include a mask layer 162 coupled over a perimeter of the low refractive index layer 164. In such implementations, the mask layer 162 may be embedded within the adhesive 166 and/or low refractive index layer 164. In other implementations, the mask layer 162 may be coupled below the low refractive index layer 164. In still other implementations, the mask layer 162 may be embedded within the low refractive index layer 164. In various implementations, the mask layer may black out light reflecting from any bond pads 168 or other reflective surfaces located at the edge of the die. The mask layer 162 in FIG. 26 extends across a street or edge region of the image sensor die. In all implementations, the mask layer 162 prevents reflection of light from metal structures 168 in the street or die region that can cause optical effects like flare when the image sensor is in use.

In various implementations, and as illustrated by FIGS. 1 and 26, no gap or cavity is present between the optically transmissive cover and the plurality of microlenses. Rather, the entire space between the optically transmissive cover 12 and the plurality of microlenses 6 is filled with the adhesive 10 and the low refractive index layer 8. Accordingly, such a package may be considered "gapless." Various implementations of the gapless image sensor packages disclosed herein may unexpectedly have optical performance similar to an image sensor package having a cavity over the image sensor. It is unexpected inasmuch as the low refractive index layer 8 and the adhesive 10 both have refractive indexes higher than that of air. However, when the low refractive index layer 8 having a refractive index of 1.2 and the adhesive 10 having the refractive index of 1.5 are placed directly over the image sensor and fill all the space between the image sensor and the optically transmissive cover 12, the combination of these two layers unexpectedly result in optical performance of the image sensor comparable to an image sensor having an air-filled cavity between the image sensor and the cover. Among other things, the gapless image sensor package allows for an image sensor package having a lower profile (as there is no need to have a cavity between the image sensor and cover) without compromising the optical performance of the image sensor.

In various implementations, the method of forming the gapless portion of the image sensor package may include applying a low refractive index layer, including any type of low refractive index layer disclosed herein, over the plurality of microlenses and an image sensor layer. The method may also include applying the adhesive, including any adhesive disclosed herein, to an optically transmissive substrate. In various implementations, the adhesive may be spin coated onto the optically transmissive substrate. The adhesive may cover an entire surface of the optically transmissive substrate. In various implementations, the method includes bonding the adhesive to the low refractive index layer. In particular implementations, the adhesive may be directly bonded to the low refractive index layer. In various implementations, the method may include curing the adhesive through an ultra violet (UV) cure or another curing process. The method may also include singulating the optically transmissive substrate, the adhesive, the low refractive index layer, and the image sensor wafer into a plurality of image sensor packages.

In implementations including a mask layer, the method may include applying the mask layer and patterning the mask layer either before or after the low refractive index layer is applied.

Figure 2:
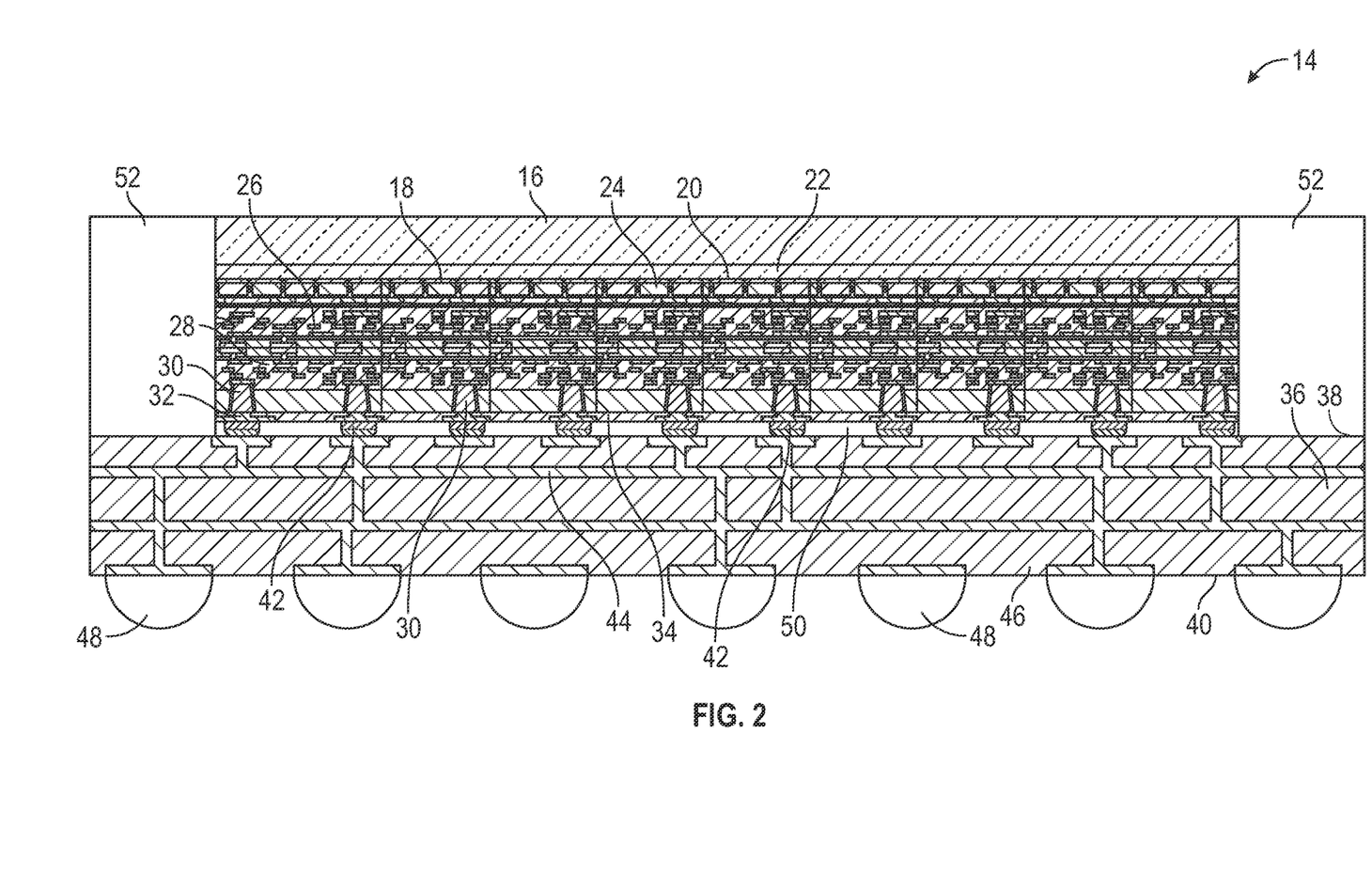
FIG. 2 is a cross-section side view of an image sensor package.

Referring to FIG. 2, a cross-section side view of an image sensor package is illustrated. The image sensor package 14 may be a flip chip package or any other type of package. As illustrated, the image sensor package 14 includes an optically transmissive cover 16. The optically transmissive cover 16 may be the same or similar to any type of cover disclosed herein. The optically transmissive cover 16 is coupled over a plurality of microlenses 18. In various implementations, though difficult to see in FIG. 2 as it is drawn closer to scale, a low refractive index layer 20 is directly coupled to and over the plurality of microlenses 18. The low refractive index layer 20 may be the same as any low refractive index layer disclosed herein. In various implementations, an adhesive 22 may be directly coupled to and over the low refractive index layer 20. The adhesive 22 may be the same as any adhesive disclosed herein. The adhesive 22 may also be directly coupled to an entire surface of the optically transmissive cover 16. Accordingly, the image sensor package 14 of FIG. 2 does not include a gap between the optically transmissive cover 16 and the plurality of microlenses 18, similar to the implementation disclosed in relation to FIG. 1. In other implementations, the image sensor package 14 may include additional layers aside from the adhesive 22 and the low refractive index layer 20 between the optically transmissive cover 16 and the plurality of microlenses 18.

As illustrated, the plurality of microlenses 18 are coupled over a CFA 24. The CFA 24 is coupled over the image sensor 26. In various implementations, the image sensor 26 is 5 μm thick. In other implementations, the image sensor may be more or less than 5 μm thick. In various implementations, the image sensor 26 may be a backside image sensor (BSI) and/or any other type of image sensor disclosed herein. As illustrated by FIG. 2, the image sensor 26 is coupled to and over a digital signal processor 28. In various implementations, the digital signal processor 28 is 5 μm thick. In other implementations, the digital signal processor 28 may be more or less than 5 μm thick. In various implementations, the image sensor 26 is hybrid bonded to the digital signal processor 28 and the digital signal processor may be an application specific integrated circuit (ASIC). As illustrated, the digital signal processor 28 may include one or more through-silicon-vias (TSVs) 30 formed in the digital signal processor 28. The TSVs may include copper or any other type of electrically conductive material. The one or more TSV's may each be coupled to a contact pad 32 formed in an oxide layer 34, where the oxide layer is coupled to the digital signal processor 28. In various implementations, the surface of the contact pads 32 facing the substrate 36 is coplanar with the surface of the oxide layer 34 facing the substrate 36. In other implementations, the surface of the contact pads 32 are recessed in from the outer surface of the oxide layer 34.

The image sensor package 14 may include a substrate 36 having a first side 38 and a second side 40 opposing the first side. As illustrated, a perimeter of the substrate 36 may be greater than a perimeter of the optically transmissive cover 16. In various implementations, the substrate 36 may include a power plane 44 and a ground plane 46 which may improve electrical performance. The first side 38 of the substrate may be coupled to the digital signal processor 28 through a plurality of electrical contacts 42. The plurality of electrical contacts 42 may be, by non-limiting example, bumps, studs, pins, pillars, balls, paste, or any other type of electrical contact. Similarly, the plurality of electrical contacts 42 may include copper, any other metal or alloy thereof, a solder, or any other conductive material. The plurality of electrical contacts 42 may be coupled to the one or more TSVs 30. In various implementations, the electrical contacts 42 improve the thermal performance of the image sensor package 14. As illustrated by FIG. 2, the image sensor package 14 may include a plurality of solder bumps/balls 48 (or other electrical connectors) coupled to the second side of the substrate.

In various implementations the image sensor package 14 includes an underfill layer 50 coupled between the substrate 36 and the digital signal processor 28. In various implementations, the underfill layer 50 may entirely fill the space between the substrate 36 and the oxide layer 34 and partially encapsulate the plurality of electrical contacts 42. The underfill may be used to assist in maintaining the reliability of the connections between the solder balls 48 and a circuit board to which the solder balls 48 are ultimately coupled. Still referring to FIG. 2, in various implementations the image sensor package 14 includes a mold compound 52. The mold compound 52 may be directly coupled to a portion of the first side 38 of the substrate 36. The mold compound 52 may also be directly coupled to two or more sides of the optically transmissive cover 16, the image sensor 26, the digital signal processor 28, and the underfill layer 50. In particular implementations, four sides of the optically transmissive cover 16, the image sensor 26, the digital signal processor 28, and the underfill layer 50 are covered (and may be directly covered) by the mold compound 52.

In various implementations the mold compound may include an epoxy molding compound, an acrylic molding compound, or any other molding compound capable of hardening and providing physical support, light blocking, and/or humidity protection to a semiconductor device.

While FIG. 2 illustrates an implementation of an image sensor having the image sensor stacked over the digital signal processor, in other implementations the image sensor and the digital signal processor may not be stacked but may be arranged side by side over the substrate (and may be on the same semiconductor die in some implementations). In such implementations, the image sensor may include a plurality of TSVs electrically coupling the image sensor to the substrate. The TSVs may be located in the periphery of the image sensor. In various implementations, the digital signal processor may or may not include TSVs.

Figure 3:
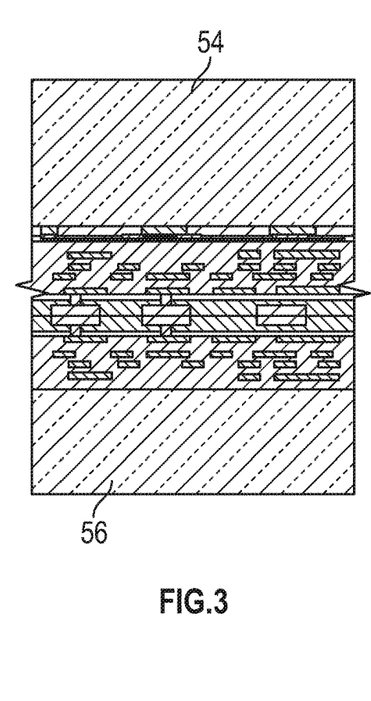
FIG. 3 is a cross-section side view of an image sensor wafer coupled to a digital signal processor wafer.

Referring to FIGS. 3-24, various methods for forming an image sensor package are illustrated. Referring specifically to FIG. 3, a cross-section side view of an image sensor wafer coupled to a digital signal processor wafer is illustrated. The method of forming an image sensor package may include bonding an image sensor wafer 54 to and over a digital signal processor wafer 56. The image sensor wafer 54 may be any type of image sensor disclosed herein and in various implementations, may be hybrid bonded to the digital signal processor wafer 56.

Figure 4:
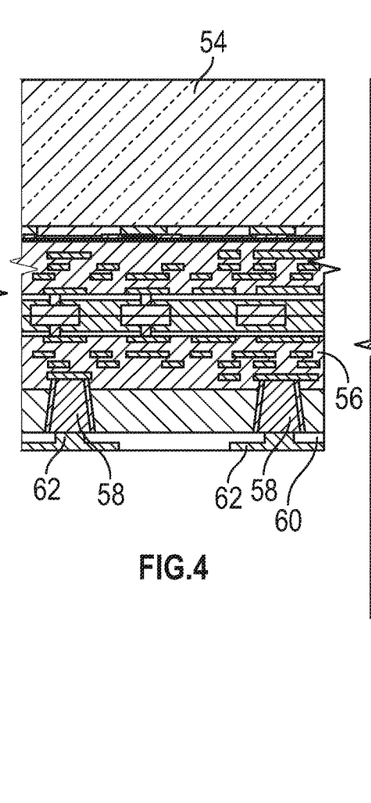
FIG. 4 is a view of FIG. 3 having the digital signal processor wafer thinned and through-silicon-vias formed therein.

Referring to FIG. 4, a view of the wafers of FIG. 3 having the digital signal processor wafer thinned and through-silicon-vias formed therein is illustrated. In various implementations, the method of forming the image sensor package may include backgrinding or thinning the digital signal processor to a predetermined thickness. In various implementations, the predetermined thickness is 5 µm, however, in other implementations the digital signal processor may be thinned to more or less than 5 µm. The method may also include forming one or more TSVs 58 in the digital signal processor 56. The TSVs 58 may be the same as or similar to any type of TSV disclosed herein. As illustrated by FIG. 4, the method may also include coupling an oxide layer 60 to the digital signal processor 56. The oxide layer 60 may include one or more electrical pads 62 which align with the TSVs 58. The electrical pads 62 may include any type of material disclosed herein.

Figure 5:
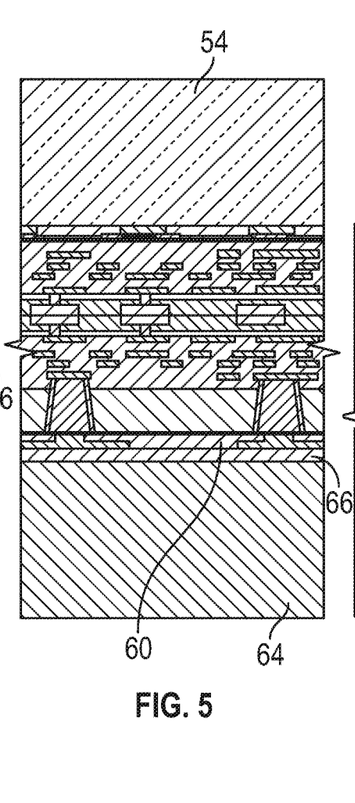
FIG. 5 is a cross-section side view of a carrier wafer coupled to the digital signal processor wafer.

Referring to FIG. 5, a cross-section side view of a carrier wafer coupled to the digital signal processor wafer is illustrated. In various implementations the method of forming an image sensor package includes coupling a carrier wafer 64 to the oxide layer 60. In various implementations, the carrier wafer 64 may have an oxide layer 66 coupled thereto, which oxide layer 66 is then bonded to the oxide layer 60.

Figure 6:
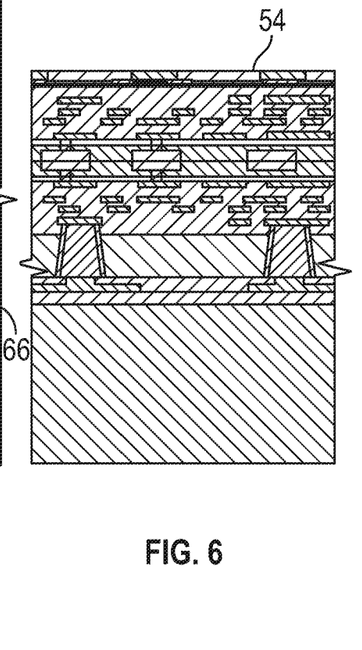
FIG. 6 is a view of FIG. 5 having the image sensor wafer thinned.

Referring to FIG. 6, a view of FIG. 5 having the image sensor wafer thinned is illustrated. In various implementations, the method of forming the image sensor package may include thinning the image sensor wafer 54 to a predetermined thickness.

Figures 7, 8:
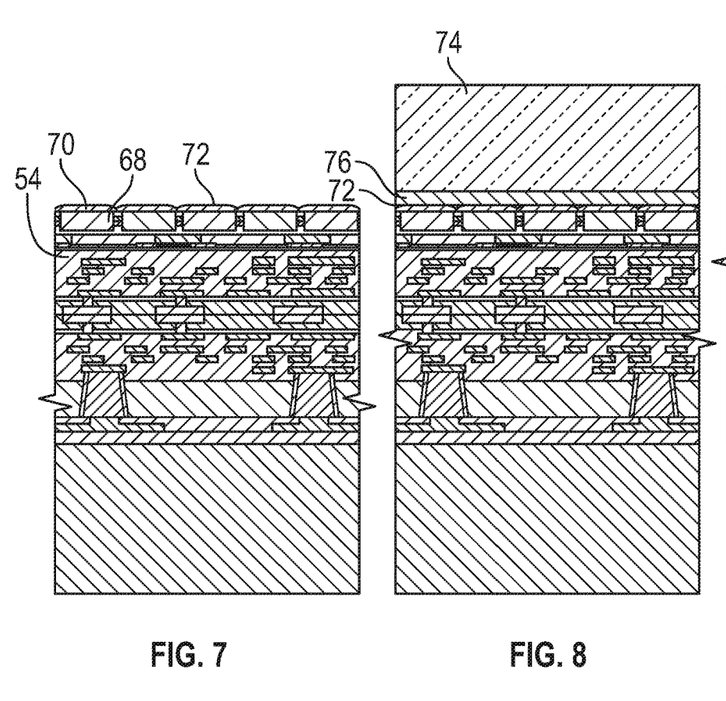
FIG. 7 is a cross-section side view of the image sensor wafer of FIG. 6 coupled to a color filter array.
FIG. 8 is a cross-section side view of a cover coupled to the image sensor wafer of and carrier wafer of FIG. 7.

Referring to FIG. 7, a cross-section side view of the image sensor wafer of FIG. 6 coupled to a color-filter-array (CFA) is illustrated. In various implementations, the method of forming an image sensor package may include forming a CFA 68 over the image sensor wafer 54. The method may also include forming a plurality of microlenses 70 over the CFA 68. In various implementations, the method includes applying a low refractive index layer 72 over the plurality of microlenses. The low refractive index layer 72 may be the same as any low refractive index layer disclosed herein, including the thickness and the material. The low refractive index layer 72 of FIGS. 7-11 and 13 is not as clearly visible due to the relative thinness of the low refractive index layer 72 compared to the other layers in the sensor stack.

Referring to FIG. 8, a cross-section side view of a cover coupled to the image sensor wafer and carrier wafer of FIG. 7 is illustrated. In various implementations, the method of forming an image sensor package includes coupling an optically transmissive substrate 74 over the image sensor wafer 54. The optically transmissive substrate will ultimately become the cover over each of the image sensors. The optically transmissive substrate may be any type of optically transmissive material disclosed herein. In various implementations, the thickness of the optically transmissive substrate 74 may be 400 µm thick. In other implementations the cover may be more or less thick than 400 µm.

In various implementations, the method of forming an image sensor package may include coupling an adhesive 76 between the optically transmissive substrate 74 and the low refractive index layer 72. The adhesive may be any type of adhesive disclosed herein, and may be applied in any thickness disclosed herein. In particular implementations, the adhesive 76 may be optically transmissive. In various implementations, the adhesive 76 may be spin coated onto the optically transmissive substrate 74 prior to coupling the optically transmissive substrate over the image sensor wafer 54. The adhesive 76 may cover an entire surface of the optically transmissive substrate 74. In various implementations, the method includes bonding the adhesive 76 to the low refractive index layer 72. In particular implementations, the adhesive 76 may be directly bonded to the low refractive index layer 72. In various implementations, the method may include curing the adhesive 76 through an ultra violet (UV) cure or another curing process. As is illustrated by FIG. 8, no gap is present between the optically transmissive substrate 74 and the image sensor wafer 54 (gapless sensors).

Figure 9:
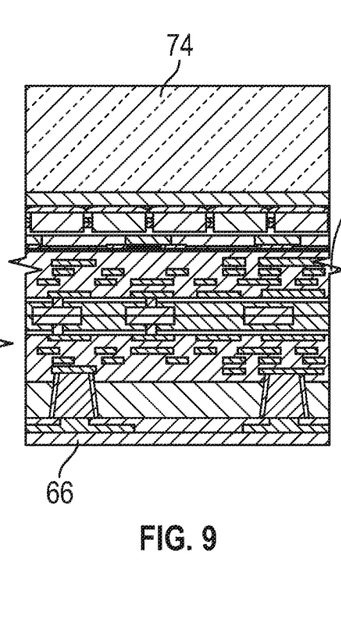
FIG. 9 is a cross-section side view of the cover and image sensor wafer of FIG. 5 with the carrier wafer removed.
Figure 10:
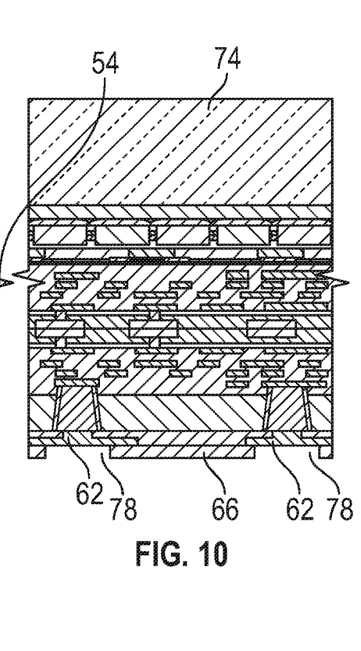
FIG. 10 is a cross-section side view of the image sensor wafer of FIG. 9 having exposed electrical pads.

Referring to FIG. 9, a cross-section side view of the cover and image sensor wafer of FIG. 5 with the carrier wafer removed is illustrated. As illustrated by FIG. 9, the method of forming an image sensor package may include removing the carrier wafer 64. The carrier wafer may be removed through a backgrinding process, an etching process, a debonding process, or any other removal process. Through removing the carrier wafer 64, the oxide layer 66 is exposed. The optically transmissive substrate 74 structurally supports the image sensor wafer 54 and the digital signal processor wafer 56 during removal of the carrier wafer. Accordingly, it may be considered that the optically transmissive substrate 74 now serves as a carrier wafer for the image sensor devices. Referring to FIG. 10, a cross-section side view of the image sensor wafer of FIG. 9 having exposed electrical pads is illustrated. In various implementations, the method of forming an image sensor package includes exposing the electrical pads 62 by etching cavities 78 through the oxide layer 66. In particular implementations, an oxide etch is then used to expose the electrical pads. While exposing the plurality of electrical pads 62, the optically transmissive substrate 74 is again used as a support.

Figure 22:
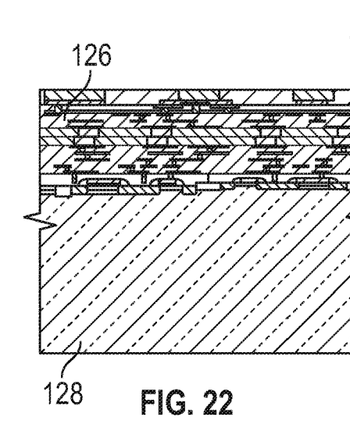
FIG. 22 is a cross section side view of an image sensor wafer coupled to a digital signal processor wafer.
Figure 23:
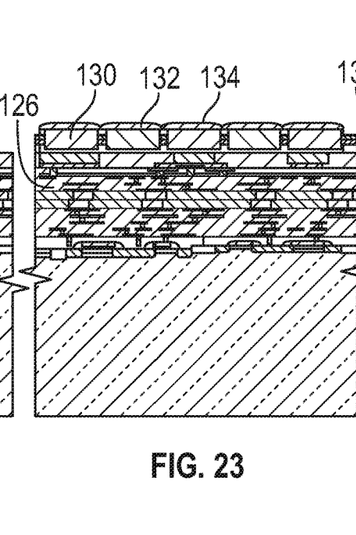
FIG. 23 is a view of FIG. 22 having a color filter array coupled over the image sensor wafer.

Another implementation of forming a substrate and wafers similar to those illustrated by FIG. 9 is illustrated by FIGS. 22-25. Referring to FIG. 22, a cross section side view of an image sensor wafer coupled to a digital signal processor wafer is illustrated. In various implementations the method of forming an image sensor package may include bonding an image sensor wafer 126 to a digital signal processor wafer 128. Referring to FIG. 23, a view of FIG. 22 having a color-filter-array coupled over the image sensor wafer is illustrated. In various implementations, the method of forming an image sensor package may include forming a CFA 130 over the image sensor wafer and a plurality of microlenses 132 over the CFA. The method may also include forming a low refractive index layer 134 over the plurality of microlenses 132. The low refractive index layer 134 may be the same as any low refractive index layer disclosed herein, including the thickness and the material. The low refractive index layer 134 of FIGS. 22-25 is not as clearly visible due to the relative thinness of the low refractive index layer 134 relative to the other layers in the stack.

Figure 24:
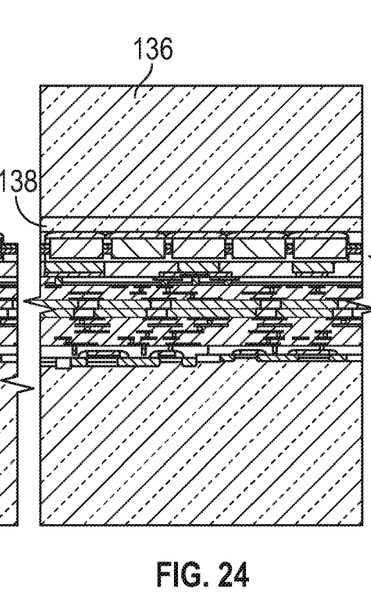
FIG. 24 is a view of FIG. 23 having a cover coupled over the color filter array.

Referring to FIG. 24, a view of FIG. 22 having a cover coupled over the color-filter-array is illustrated. In various implementations, the method of forming an image sensor package includes coupling an optically transmissive substrate 136 over the image sensor wafer 126 that then acts as the cover over each image sensor. The optically transmissive substrate 136 may be any type of optically transmissive material disclosed herein. In various implementations, the thickness of the optically transmissive substrate 136 may be 400 µm thick. In other implementations the cover may be more or less thick than 400 µm.

In various implementations, the method of forming an image sensor package may include coupling an adhesive 138 between the optically transmissive substrate 136 and the low refractive index layer 134. The adhesive may be any type of adhesive disclosed herein, and may be applied in any thickness disclosed herein. In particular implementations, the adhesive 138 may be optically transmissive. In various implementations, the adhesive 138 may be spin coated onto the optically transmissive substrate 136 prior to coupling the optically transmissive substrate over the image sensor wafer 126. The adhesive 138 may cover an entire surface of the optically transmissive substrate 136. In various implementations, the method includes bonding the adhesive 138 to the low refractive index layer 134. In particular implementations, the adhesive 138 may be directly bonded to the low refractive index layer 134. In various implementations, the method may include curing the adhesive 138 through an ultra violet (UV) cure or another curing process. As is illustrated by FIG. 24, no gap is present between the optically transmissive substrate 136 and the image sensor wafer 126 forming a plurality of gapless image sensors.

In various implementations, referring to FIG. 26, the method may include applying/forming a mask layer 162 around an edge/perimeter of the image sensor die after, before, or during application of the low refractive index layer 164. In other implementations, the method may include applying/forming a mask layer 162 around an edge/perimeter of the image sensor die after, before, or during application of the adhesive layer 166. FIG. 26 illustrates the structure following application/forming of the mask layer 162 before application of the low refractive index layer 164 but before/during the application of the adhesive layer 166.

Figure 25:
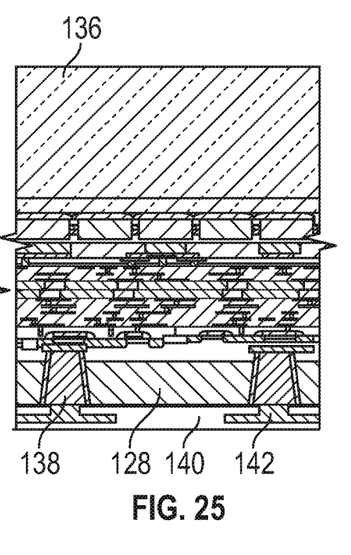
FIG. 25 is a view of FIG. 24 having the digital signal processor wafer thinned and through-silicon-vias formed therein.

Referring to FIG. 25, a view of FIG. 24 having the digital signal processor wafer thinned and through-silicon-vias formed therein is illustrated. In various implementations, the method of forming the image sensor wafer includes thinning the digital signal processor wafer 128 to a predetermined thickness. In various implementations, the digital signal processor wafer 128 may be thinned through backgrinding the wafer. The optically transmissive substrate 136 acts as a mechanical support like a carrier wafer during thinning of the digital signal processor wafer 128 so that no additional carrier wafer is needed during the thinning process. Upon thinning the digital signal processor wafer, a plurality of TSVs 139 may be formed in the digital signal processor and an oxide layer 140 having electrical pads 142 formed therein may be coupled to the digital signal processor wafer. This method depicted by FIGS. 22-25 varies from the other methods disclosed herein inasmuch as it does not utilize a carrier wafer aside from the optically transmissive substrate 136.

Figure 11:
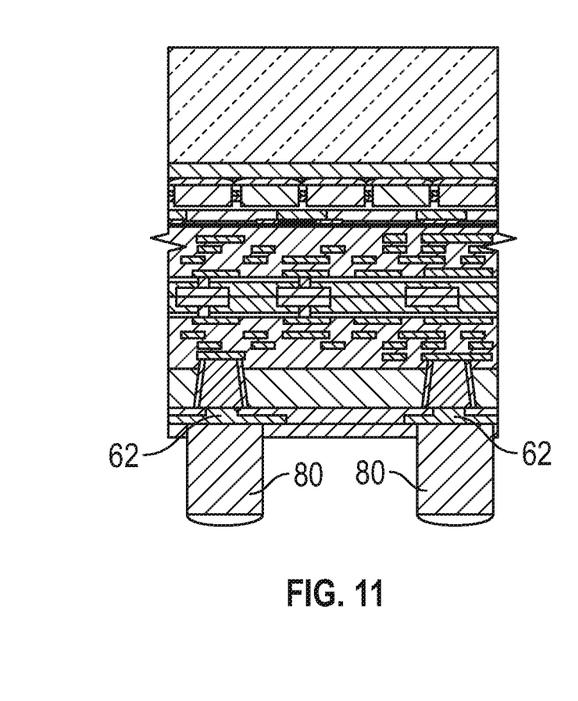
FIG. 11 is a cross section side view of the image sensor wafer of FIG. 10 having a plurality of electrical contacts coupled to the electrical pads.
Figure 12:
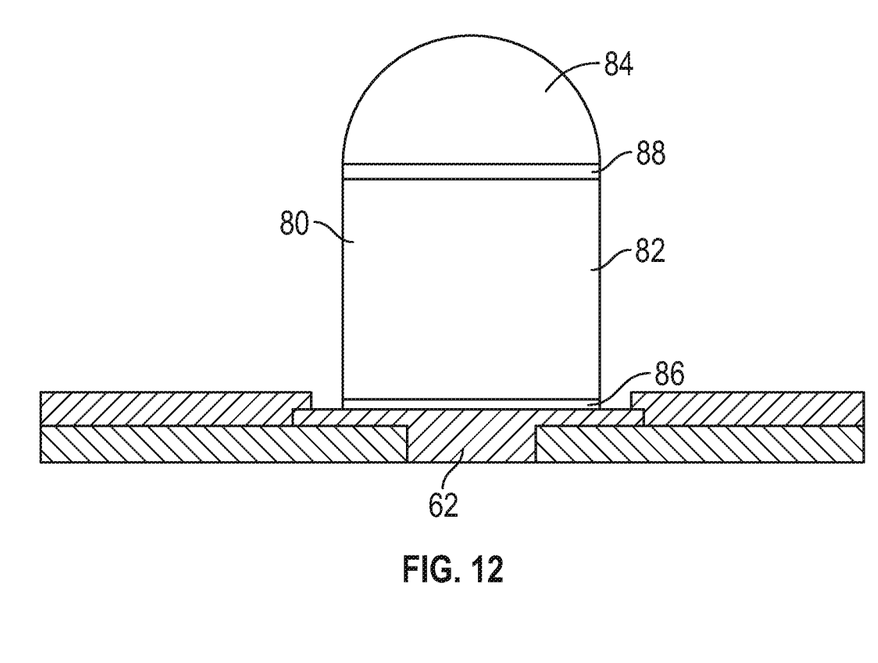
FIG. 12 is a side view of an electrical contact.

Referring to FIG. 11, a cross section side view of the image sensor wafer of FIG. 10 having a plurality of electrical contacts coupled to the electrical pads is illustrated. In various implementations, the method of forming an image sensor package includes coupling a plurality of electrical contacts 80 to the plurality of electrical pads 62. The optically transmissive substrate 74 acts as the carrier wafer during the application of the electrical contacts 80 to the electrical pads 62. The electrical contacts 80 may include, by non-limiting example, bumps, studs, pillars, posts, balls, or any other type of electrical contact. Further, the electrical contacts 80 may include copper, any other metal or alloy thereof, solder, a conductive paste, or any other electrically conductive material. Referring to FIG. 12, a side view of an implementation of an electrical contact is illustrated. In various implementations, the electrical contact may include a pillar/stud 82 coupled to a bump 84. In particular implementations, the pillar may include plated copper and the bump 84 may include a solder cap. A titanium/copper layer 86 may separate the copper pillar from the electrical pad 62. In various implementations, a plated nickel layer 88 may separate the pillar 82 from the bump 84.

Figure 13:
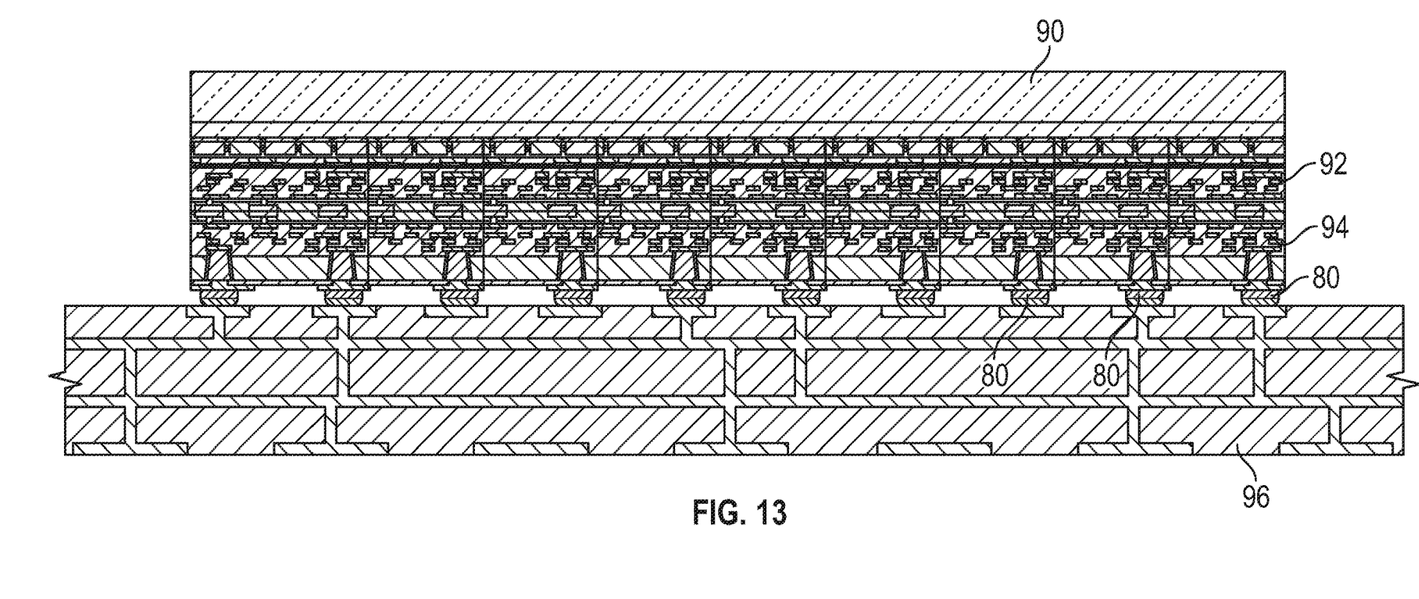
FIG. 13 is a cross-section side view of an image sensor coupled to a substrate.
Figure 14:
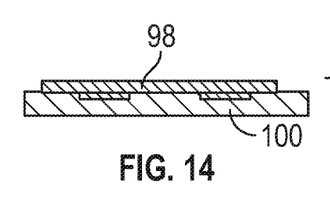
FIG. 14 is a side view of a layer of flux applied to a substrate.

Referring to FIG. 13, a cross-section side view of an image sensor coupled to a substrate is illustrated. In various implementations the method of forming an image sensor package may include singulating the optically transmissive substrate 74 into a plurality of optically transmissive covers 90, singulating the image sensor wafer into a plurality of image sensor die 92, and singulating the digital signal processor wafer 56 into a plurality of digital signal processor die 94. The method may include coupling each digital signal processor die 94, having an image sensor die 92 and an optically transmissive cover 90 coupled thereto, to a substrate 96. The digital signal processor die may be coupled to the substrate 96 through the plurality of electrical contacts 80. The substrate 96 may be bonded to the electrical contacts using any of the methods illustrated by FIGS. 14-20. Referring to FIGS. 14-17, a first method of bonding the electrical contacts to a substrate is illustrated. Referring specifically to FIG. 14, a side view of a layer of flux applied to a substrate is illustrated. In various implementations, the method may include applying a layer of flux 98 to a substrate 100.

Figure 15:
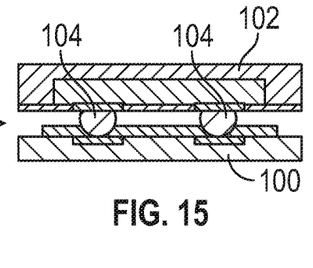
FIG. 15 is a side view of chip having a ball grid array mounted on the substrate.
Figure 16:
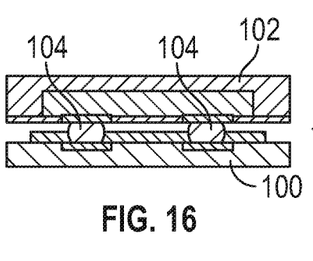
FIG. 16 is a side view of the chip and substrate of FIG. 15 after reflow.
Figure 17:
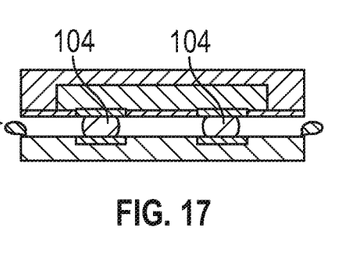
FIG. 17 is a view of FIG. 16 after the flux is removed.
Figure 18:
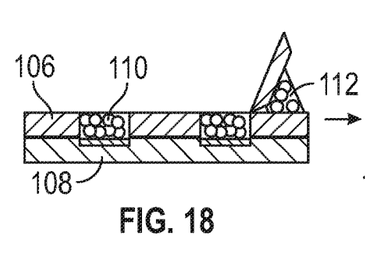
FIG. 18 is a side view of a paste applied to a substrate.
Figure 19:
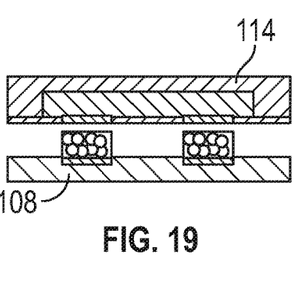
FIG. 19 is a view of FIG. 18 with the stencil removed and a chip positioned over the substrate.
Figure 20:
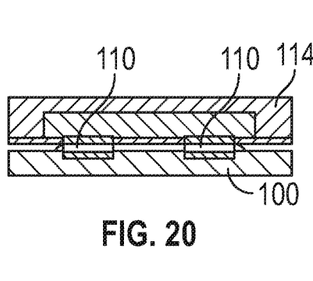
FIG. 20 is a view of the chip of FIG. 18 bonded to the substrate after reflowing the paste.

Referring to FIG. 15, a side view of chip having a ball grid array mounted on the substrate is illustrated. The method may include mounting a chip or die 102 having a plurality of electrical contacts 104 over the substrate 100. Referring to FIG. 16, the method may include reflowing the electrical contacts 104 to bond the die 102 to the substrate 100. In various implementations, reflow may be done at 260 degrees Celsius. In other implementations, reflow may be done at a higher or lower temperature. Referring to FIG. 17, the method may include removing the layer of flux 98 through a defluxing and drying process. Referring to FIGS. 18-20, a second method of bonding electrical contacts to a substrate is illustrated. Referring to FIG. 18, a side view of a paste applied to a substrate is illustrated. In various implementations, the method may include coupling a stencil over a substrate and applying a conductive paste 110 to the substrate 108. In various implementations, the paste 110 may be printed onto the substrate 108 at a thickness of about 80 microns. As illustrated by FIG. 18, the method may include removing any excess paste 112. Referring to FIG. 19, a view of FIG. 18 with the stencil removed and a chip positioned over the substrate is illustrated. In various implementations, the method may include removing the stencil 106 and mounting a die 114 over the substrate 108. Referring to FIG. 20, a view of the chip of FIG. 18 bonded to the substrate after reflowing the paste is illustrated. Upon positioning the die 114 over the substrate 108, the conductive paste 110 may be reflowed and the die 114 may be bonded to the substrate 108. In such implementations, the conductive paste may be reflowed at a temperature of 150 degrees Celsius for approximately five minutes. In other implementations, the reflow temperature may be more or less than 150 degrees Celsius and the paste may be reflowed for more or less than five minutes. While the method depicted by FIGS. 11-13 illustrate the die being bonded to the substrate through a plurality of pillars and bumps, it is understood that in other implementations the methods disclosed herein may include bonding the die to the substrate through solder paste in a pad-to-pad structure rather than using balls/pillars. Accordingly, either method depicted by FIGS. 14-20 may be used in bonding the die to the substrate in the methods disclosed herein.

Figure 21:
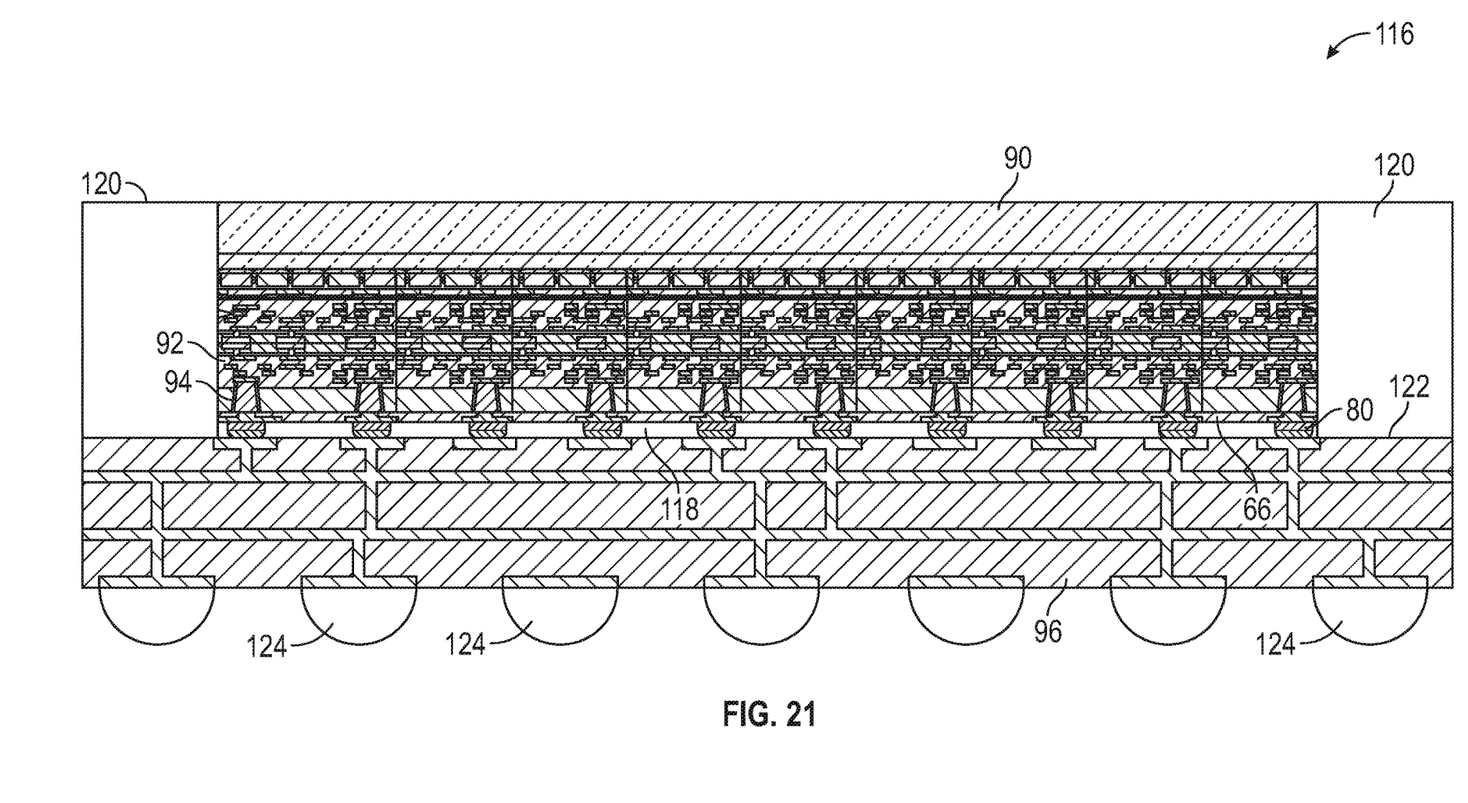
FIG. 21 is a view of an image sensor package.

Referring to FIG. 21, a cross-sectional side view of an image sensor package is illustrated. As illustrated, the image sensor package 116 formed by the methods disclosed herein may be the same as the image sensor package 14 of FIG. 2. In various implementations, the method of forming an image sensor package 116 includes applying an underfill layer 118 between the oxide layer 66 and the substrate 96. Accordingly, the underfill compound may be between each of the plurality of electrical contacts 80. The method may include using a capillary underfill process, a liquid encapsulation process, or any other encapsulation/underfill process. In various implementations, the method may also include applying a mold compound 120 to a portion of the first side 122 of the substrate 96. The mold compound 120 may also be directly coupled to two or more sides of the optically transmissive cover 90, the image sensor die 92, the digital signal processor die 94, and the underfill layer 118. In particular implementations, four sides of the optically transmissive cover 90, the image sensor die 92, the digital signal processor die 94, and the underfill layer 118 are covered (and may be directly covered) by the mold compound 120. In various implementations the mold compound may include an epoxy molding compound, an acrylic molding compound, or any other molding compound capable of hardening and providing physical support and/or humidity protection to a semiconductor device.

In various implementations, the method of forming the image sensor package includes forming a plurality of electrical contacts 124 to the second side of the substrate opposing the first side 122 of the substrate 96. The electrical contacts may be any type of electrical contact disclosed herein. The method of forming an image sensor package also includes singulating the mold compound 120 and the substrate 96 into a plurality of image sensor packages 116. The various methods disclosed herein do not include die-level keep out zones.

While the implementations of the methods of forming an image sensor package disclosed herein primarily refer to methods of forming image sensor packages having an image sensor stacked over a digital signal processor, in other implementations, methods of forming an image sensor package may include forming a package not having an image sensor stacked over a digital signal processor. In such implementations, the image sensor may be arranged side by side with the digital signal processor over the substrate (or included together in the same die). In such implementations, the method of forming the image sensor package may include coupling an optically transmissive substrate over and to a wafer including both image sensors and digital signal processors. In various implementations, the method may include forming a plurality of TSVs in the wafer including image sensors and digital signal processors. In various implementations, the method may also include singulating the wafer including image sensors and digital signal processors into die including an image sensor and a digital signal processor. In such implementations each die may then be coupled over a substrate individually or simultaneously. In various implementations, an underfill layer and/or mold compound may be coupled over the substrate similar to any method disclosed herein and the substrate and/or the mold compound may be singulated into image sensor packages.

The various implementations of methods of forming image sensor packages disclosed herein include methods of forming image sensor packages where no gap is present between the optically transmissive cover of the package and the image sensor die. In the methods of forming the flip chips disclosed herein the flip chip is self-aligning when the solder reflows and then solidifies. This is because the use of the bumps helps the image sensor to stay in the desired location during the reflow process. Similarly, when forming the flip chip, the die position in each of the X and Y directions may be affected by less than 10 μm. Similarly, the die tilt may be affected by less than 0.1 degrees and the die rotation is affected by less than 0.2 degrees. The use of the gapless image sensor implementations in this document permits the use of pillar/ball electrical connectors, which allows for more precise die placement and avoidance of die tilt when compared with wirebonded image sensor die processing in a physically smaller package size.

In places where the description above refers to particular implementations of image sensor packages and implementing components, sub-components, methods and sub-methods, it should be readily apparent that a number of modifications may be made without departing from the spirit thereof and that these implementations, implementing components, sub-components, methods and sub-methods may be applied to other image sensor packages.

What is claimed is:

1. An image sensor package comprising:
a die coupled to a color filter array (CFA);
a plurality of microlenses coupled over the CFA;

a low refractive index layer directly coupled to and over the plurality of microlenses;

a mask layer directly coupled to and between the low refractive index layer and the die;

an adhesive directly coupled to and over the low refractive index layer; and an optically transmissive cover directly coupled to and over the adhesive;

wherein the mask layer extends to an outer perimeter of the low refractive index layer; and wherein the low refractive index layer separates the mask layer from the plurality of microlenses.

2. The image sensor package of claim 1, wherein the low refractive index layer comprises one of an acrylic resin, polymer resins, an inorganic filler, inorganic fillers, an aerogel material, or any combination thereof.

3. The image sensor package of claim 1, wherein the low refractive index layer comprises a refractive index of 1.2.

4. The image sensor package of claim 1, wherein the low refractive index layer comprises a thickness less than 5 micrometers.

5. The image sensor package of claim 1, wherein the adhesive is directly coupled to an entire surface of the optically transmissive cover.

6. The image sensor package of claim 1, wherein the mask layer is embedded within the low refractive index layer.

7. An image sensor package comprising:

a first side of a substrate coupled to an oxide layer through a plurality of electrical contacts, wherein the plurality of electrical contacts are directly coupled to and are entirely between the substrate and the oxide layer;

a digital signal processor directly coupled to the oxide layer;

a plurality of through silicon vias (TSVs) formed in the digital signal processor;

an image sensor coupled over the digital signal processor;

an underfill layer coupled between the substrate and the oxide layer;

a plurality of microlenses coupled over the image sensor;

an optically transmissive cover coupled over the plurality of microlenses; and a mold compound directly coupled to the first side of the substrate and to two or more sides of each of the optically transmissive cover, the image sensor, the digital signal processor, and the underfill layer;

wherein each electrical contact of the plurality of electrical contacts is formed directly under a TSV of the plurality of TSVs.

8. The image sensor package of claim 7, further comprising an adhesive and a low refractive index layer coupled between the optically transmissive cover and the plurality of microlenses.

9. The image sensor package of claim 8, wherein the low refractive index layer comprises an acrylic resin, polymer resins, an inorganic filler, inorganic fillers, an aerogel material, or any combination thereof.

10. The image sensor package of claim 7, wherein a perimeter of the optically transmissive cover is smaller than a perimeter of the substrate.

11. The image sensor package of claim 8, wherein the low refractive index layer comprises a refractive index of 1.2.

12. The image sensor package of claim 7, wherein the image sensor is stacked over the digital signal processor and the digital signal processor is stacked over the substrate.

13. The image sensor package of claim 7, wherein the mold compound is a continuous mold compound.

14. The image sensor package of claim 7, wherein the mold compound is directly coupled to two or more entire sides of the optically transmissive cover.

15. An image sensor package comprising:

a first side of a substrate coupled to an oxide layer through a plurality of electrical contacts, wherein the plurality of electrical contacts are directly coupled to and are entirely between the substrate and the oxide layer;

a digital signal processor directly coupled to the oxide layer;

a plurality of through silicon vias (TSVs) formed in the digital signal processor;

an image sensor coupled over the digital signal processor;

an underfill layer coupled directly to and between the substrate and the oxide layer;

a color filter array (CFA) coupled over the image sensor;

a plurality of microlenses coupled over the CFA;

a low refractive index layer directly coupled to and over the plurality of microlenses;

an adhesive directly coupled to and over the low refractive index layer; and an optically transmissive cover directly coupled to and over the adhesive;

wherein the digital signal processor and the image sensor are coupled over the first side of the substrate;

wherein the image sensor is stacked over the digital signal processor and the digital signal processor is stacked over the substrate;

wherein a width of the substrate is greater than a width of the digital signal processor; and wherein each electrical contact of the plurality of electrical contacts is electrically coupled to and directly under a TSV of the plurality of TSVs.

16. The image sensor package of claim 15, further comprising a mold compound directly coupled to the first side of the substrate and to two or more sides of each of the optically transmissive cover, the image sensor, the digital signal processor, and the underfill layer.

* * * * *